July 23, 1963 W. H. AYER ETAL 3,098,951
WELDABLE CIRCUIT CARDS
Filed Oct. 29, 1959 2 Sheets-Sheet 1

INVENTORS
WILLIAM H. AYER
ROBERT W. JOSLIN
BY Moses, Nolte + Nolte
ATTORNEYS

WELDABLE CIRCUIT CARDS

Filed Oct. 29, 1959 2 Sheets-Sheet 2

INVENTORS
WILLIAM H. AYER
ROBERT W. JOSLIN
BY
Moses, Nolte & Nolte
ATTORNEYS

United States Patent Office 3,098,951
Patented July 23, 1963

3,098,951

WELDABLE CIRCUIT CARDS

William H. Ayer, Scituate, and Robert W. Joslin, Marion, Mass., assignors, by mesne assignments, to The Sippican Corporation, Marion, Mass., a corporation of Massachusetts Filed Oct. 29, 1959, Ser. No. 849,577
4 Claims. (Cl. 317—101)

This invention relates to printed circuits in general and in particular to improvements in the electrical interconnection of circuits applied to opposite sides of an insulating board. The invention also relates to improved methods of electrical connection of components to their associated printed or etched wires.

As miniaturization, ease of manufacture and reliability have become more and more important in modern electronic packaging the use of printed circuits has greatly increased. Many modern printed circuit boards have conductor strips on both sides thereof and employ conductive means inserted into holes passing through the board to electrically interconnect circuits on one side of the board to selected circuits on the opposite side.

Two methods employed in the prior art for interconnecting opposite side conductor strips are the use of conductive eyelets and rivets or the electro-deposition of conductive material in a communicating hole. These techniques have caused many reliability problems due to improper eyelet insertion or non-uniform electroplating techniques and in general have proven unsatisfactory and costly.

The present invention, unlike the prior art, removes the need for inserting a separate conductive element into a non-conductive hole in the insulating board to thereby interconnect circuits on either side of the board. The invention by providing printed wiring extending over the hole portion in the board permits the integral forming of the interconnecting element from the printed wiring proper. With a circuit board having a hole bridged by opposite side conductors the interconnection thereof is easily accomplished by welding together those portions spanning the hole.

In the method of manufacture of the invention, the holes over which it is desired to have the printed circuit travel, are first punched or drilled in the insulating body portion of the board. These holes are then filled with a dissimilar type material, such as paraffin, epoxy resin, etc., so that later removal of the filling compound is possible without damage to the remainder of the board. With this type of insulating board preparation the desired printed or etched circuit is applied to either or both sides in any one of numerous well known ways. With the hole thus filled, the etching solution is prevented from dissolving the back side of the conductor portion which bridges the hole. Upon the subsequent removal of the hole filling material or compound, it is now apparent that a conductor has been provided that bridges the hole portion which may easily be welded to a similar conductor bridging the same hole on the other side of the board to thereby provide positive, reliable, electrical interconnection between circuits on opposite sides of the insulating sheet. It should be noted that the invention has provided this interconnection of circuits without the use of a third element, such as an eyelet or electrodeposited conductor within the hole.

In another form of the invention, wherein it is merely desired to provide an improved means for connection between a component lead and a printed circuit, it has been found that a portion of the printed conductor extending over a previously drilled and filled hole provides a convenient tab member which can be easily formed to an angle 90° to the board and thereafter welded to a component lead projecting through the associated hole. These connection tabs could be formed over a previously drilled and filled hole in the board or in the alternative could be provided by merely transferring the required conductor pattern to a pre-punched insulating sheet. This technique would also yield the product of the invention, namely providing excess printed conductor length adequate for welded connection directly to a component lead or another printed conductor.

In still another form of the invention eyelet assemblies are inserted into holes in the insulating board and are provided with extending tab portions which allow easy welded connection with associated conductors.

It is therefore an object of the invention to provide an improved means for connecting printed circuits located on opposite sides of an insulating sheet.

Another object of the invention is to provide an improved method for attachment of a printed circuit conductor directly to a component lead by welding.

A still further object of the invention is to provide a new method for constructing printed circuit boards.

Still another object of the invention is to provide a printed circuit board which is extremely reliable in operation, more rugged in construction, highly adaptable to welding techniques and economical to manufacture.

The novel features which are believed to be characteristic of the invention are set forth with particularity in the appended claims, but the invention will best be understood by reference to the following description taken in connection with the accompanying drawings in which:

Figure 1:
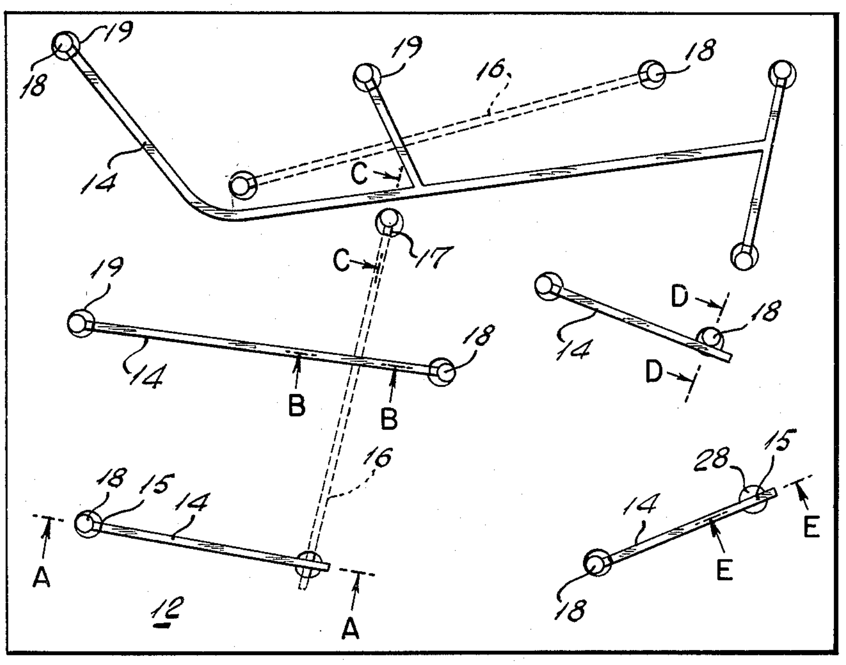
FIG. 1 is a top plan view of a representative printed circuit board containing the invention.

Referring to the drawings, and in particular to FIG. 1, a printed circuit board is shown generally at 10 having a rectangular outline and being composed of an insulating portion 12 and upper and lower conductive circuits designated respectively 14 and 16. The insulating board or sheet 12 has a plurality of spaced apertures designated 19 which communicate with the upper and lower surfaces of the board. In many of these spaced apertures 19 appear component leads or wires designated 18 which are connected in various ways to either the upper and lower conductive circuits 14 and 16. In the various figures the welded areas 20, 22 and 24 provide the means for electrical connection between circuits.

Figure 6:
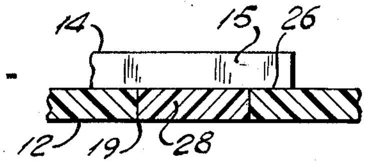
FIG. 6 is a cross sectional view taken along line E—E of FIG. 1.

In accordance with the invention the insulating board or sheet 12 is formed with apertures 19 communicating with opposite sides of the board. Upon forming these holes they are filled with a compound which can be removed at a later step in the process of manufacture. This removable compound can be any substantce of a dissimilar nature from the insulating board so that later dissolving or washing out is possible. Alternatively, the filling material could be of like substance with the insulating board material but merely held within the aperture by friction or a weak adhesive. At this stage in the printed circuit board fabrication, the printed wiring can be applied to the insulating board in any one of many conventional ways for applying the conductive material, such as a photo deposition or etching process. In FIG. 6 the filling compound 28 is shown in the aperture 19 with an upper conductor tab portion 15 extending thereover. Once the conductor ribbons have been applied to the insulating board the aperture filling material 28 is removed. In the instance wherein this material is a wax it may be washed out with any known solvent therefor which will not affect the rest of the board. The hole filling compound is no longer necessary because it has performed its function of providing a surface upon which the conductors 14 and 16 could be applied. The subsequent removal of the hole filling material thereby provides the etched conductor with an end portion 15 or 17 which transverses and slightly overlaps the aperture 19. A weak adhesion area 26 is provided under the extending tab portion 15 of an upper conductor 14 so that easy severance of this end of the conductor is possible. This allows the bending of the tab portion to an angle relative to the plane of the insulating board.

Figure 2:
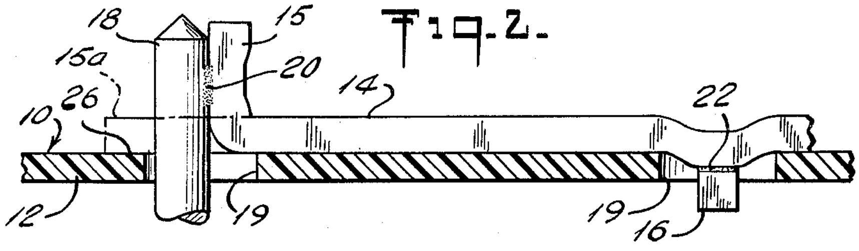
FIG. 2 is a cross sectional view taken along line A—A of FIG. 1.
Figure 3:
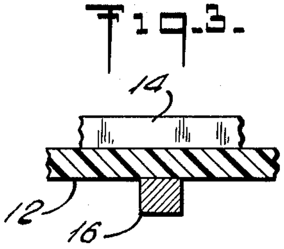
FIG. 3 is a cross sectional view taken along line B—B of FIG. 1.

Referring to FIG. 2, the dotted tab 15*a* is illustrative of the position of the tab portion 15 prior to bending away from the insulating board. A component lead shown as 18 is easily insertable through the hole 19 and has been welded at 20 to the tab portion 15 thereby providing excellent mechanical and electrical connection. Because the invention provides an excess of usable length of conductor ribbon it is readily adaptable to welding techniques. These preferred welded electrical connections are inherently able to withstand the high operating temperatures of modern electronic equipment. In the prior art wherein no excess conductor length was available a low melting point solder connection was usually mandatory.

In the electrical interconnection of the printed circuitry on opposite sides of the board a hole is provided at any suitable place on the board where opposite side circuits intersect. This hole is formed and filled with a removable compound in a similar fashion. After application of the printed circuity over the removable filling, the filling is removed leaving the upper conductor 14 crossing the lower conductor 16. Electrical connection is easily accomplished in this area by welding of the two conductors through the apperture 19 forming a weld 22.

Figure 4:
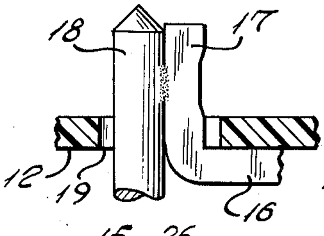
FIG. 4 is a cross sectional view taken along line C—C of FIG. 1.

In FIG. 4 the end tab portion 17 of the lower conductor 16 has been inserted through its associate aperture to extend to the opposite side of the board. A component lead 18 has been similarly welded to the tab 17.

Figure 5:
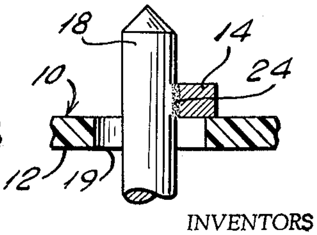
FIG. 5 is a cross sectional view taken along line D—D of FIG. 1.

FIG. 5 shows a component lead welded at 24 to the vertical edge of a conductor 14. The conductor 14 in this instance is placed closer to the outer periphery of the aperture 19.

FIG. 6 shows the step in the process of manufacture before the removal of the hole filling compound but prior to the forming of the tab portion 15 of the upper conductor 14.

In the embodiments illustrated the ratio of aperture diameter to insulating board and conductor thickness has been held relatively large. This large hole-to-thickness ratio provides ample conductor length for tab workability for formation into a connecting aperture for welding to the conductor on the opposite side of the board. In one application the insulating sheet 12 has had a thickness of approximately .005 inch while an aperture diameter of .030 inch was found acceptable. It should be understood that various insulating board thicknesses could be used without departing from the scope of the invention. In like manner, the ratio of conductor-to-board-to-aperture dimensions could be varied considerably. The only necessary requirement being that sufficient workability remain in the conductors so that contact may be made with a similar, opposite side, conductor.

Figure 7:
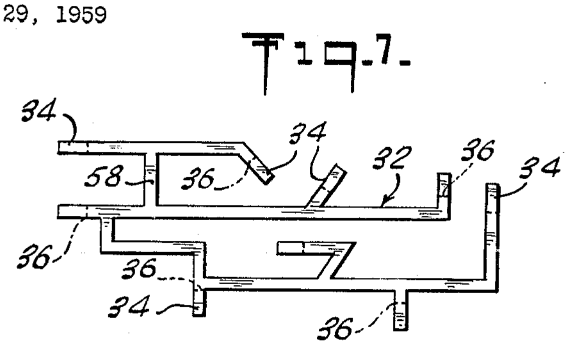
FIG. 7 is a top plan view of a conductor layout prior to transfer to a pre-punched insulating sheet.
Figure 8:
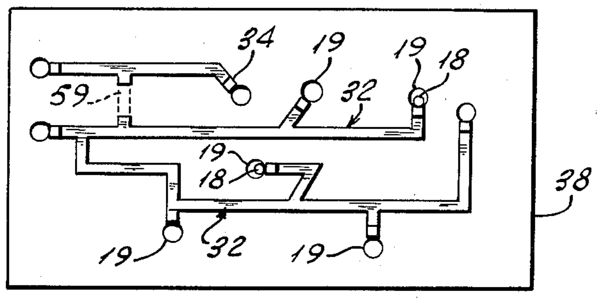
FIG. 8 is a top plan view of the conductor of FIG. 7 after transfer to the insulating sheet and the bending of the hole bridging tab portions.

Referring to FIG. 7 a preformed conductor network 32 is shown having terminating tab portions 34. These tab portions are later formed to an approximately 90° angle relative to the plane of the network 32 by bending along the dotted lines 36. The network 32 has a portion 58 which forms an interconnecting bridge between the various circuits. This interconnecting bridge gives the preformed network 32 the necessary mechanical rigidity prior to transfer to an insulating board 38. In FIG. 8, the network 32 has been applied to an insulating board 38 having apertures 19 pre-punched therein. The tab portions 34 are in registry with the apertures 19 and may be readily welded to component leads 18 projecting therethrough. The network 32 after transfer and securing to the insulating board 38 may be severed into several or more electrically isolated circuits. The dotted portion 59 indicates the area created by the removal of the interconnecting portion 58, thereby electrically isolating the upper and lower portions of the conductor network 32. In this form of the invention it can be seen that weldable conductor tab portions 34 have been provided on a printed circuit board without the necessity for filling and subsequently removing the filler material from a prepunched hole. This has been accomplished by the preforming of the conductor network prior to its application onto the insulating mounting structure.

Figure 9:
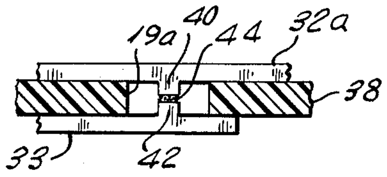
FIG. 9 is a cross sectional view of another form of the invention.

In FIG. 9 upper and lower printed circuit networks are shown respectively at 32*a* and 33. These conductors have thickened protruding portions 40 and 42, respectively, which extend into an aperture 19*a* in the board 38. Because of the relative thickness of the board, to the diameter of the aperture 19*a*, the protruding portions 40 and 42 are provided so that the opposite surface conductors may be easily welded together at 44 without the fracture of either the upper or lower conductors. The thickened portions 40 and 42 may be produced by the additional depositing of electroplated material in these areas, or alternatively, by the welding of a second element to this portion of the conductor.

Figure 10:
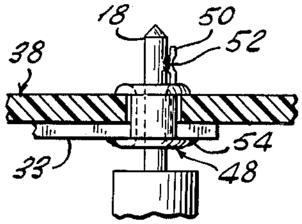
FIG. 10 is a cross sectional view of a circuit board with an improved eyelet assembly having a tab portion for component attachment.
Figure 11:
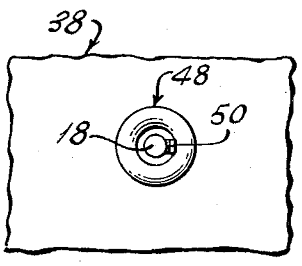
FIG. 11 is a top plan view of the improved eyelet assembly of FIG. 10.

FIGS. 10 and 11 show an improved eyelet assembly 48 which has an extending tab portion 50 which allows efficient weldable connection to a component lead 18 at weld 52. The eyelet assembly 48 may also be easily welded at 54 to a printed circuit conductor 33 on the lower side of the conductor board 38.

It can now be readily seen how the invention has permitted conductors on opposite sides of the printed circuit board to be interconnected without the use of a conventional eyelet assembly or an aperture electroplating technique. By the elimination of these two prior art methods their associated unreliability has been removed. In addition, the invention has provided added printed circuit conductor length which is deformable from the plane of the insulating board and directly weldable to a component lead. The improved board of the invention is therefore totally adaptable to welding connection methods and accordingly eliminates the need for all soldering. The advantages of welding over soldering are considerable in view of the fact that the welding process can be more accurately controlled. This is particularly important to prevent overheating of the components being attached to the printed circuit board, which so frequently occurs during a soldering process. Machine welding techniques may be automatically controlled and performed and only require short duration localized heat.

While a specific embodiment of the invention has been shown and described in detail to illustrate the application of the invention principles, it will be understood that the invention may be embodied otherwise without departing from such principles.

What is claimed is:

1. A printed circuit board comprising a first conductor bonded on one side of the board, a second conductor bonded on the opposite side of the board crossing said first conductor, means filling a hole located through the board at the point where the first and second conductors cross with a removable compound, and means for directly fastening said first conductor to said second conductor upon removal of said compound whereby electrical continuity is obtained between conductors on opposite sides of the printed circuit board.

2. The method of making a printed circuit board comprising the steps of forming spaced apertures through the insulating sheet portion thereof, filling the apertures with a removable insulating compound, forming the desired circuit upon both sides of the insulating sheet wherein portions of opposite circuits cross at the locations of the filled apertures, removing the insulating compound from the apertures, and selectively welding the conductors on opposite sides of the insulating sheet to one another through the apertures to thereby electrically connect circuits on opposite sides of said insulating sheet.

3. The method of making a printed circuit construction comprising forming spaced apertures in an insulating sheet, filling said apertures with removable insulating compound, forming the desired circuit upon the insulating sheet wherein certain portions of the circuit extend over the filled apertures, removing the insulating compound from the apertures, and selectively welding electrical components to the circuit at the location of said apertures.

4. The method of making a printed circuit, comprising, forming spaced apertures in an insulating sheet, filling said apertures with a removable compound, applying the desired circuit to the insulating sheet wherein certain portions of the circuit extend over the filled apertures, removing the compound from the apertures, and bending those portions of the circuit which extend over the apertures at substantially right angles to the plane of said insulating sheet.

References Cited in the file of this patent

UNITED STATES PATENTS

| | | |
|---|---|---|
| 1,939,130 | Mills | Dec. 12, 1933 |
| 2,019,625 | O'Brien | Nov. 5, 1935 |
| 2,581,967 | Mitchell | Jan. 8, 1952 |
| 2,586,854 | Myers | Feb. 26, 1952 |
| 2,683,839 | Beck | July 13, 1954 |
| 2,694,249 | Kapp | Nov. 16, 1954 |
| 2,758,256 | Eisler | Aug. 7, 1956 |
| 2,774,052 | Flour | Dec. 11, 1956 |
| 2,889,393 | Berger | June 2, 1959 |
| 2,907,925 | Parsons | Oct. 6, 1959 |
| 2,934,679 | Johnson | Apr. 26, 1960 |
| 3,013,188 | Kohler | Dec. 12, 1961 |

FOREIGN PATENTS

| | | |
|---|---|---|
| 220,308 | Australia | June 12, 1958 |
| 602,492 | Great Britain | May 27, 1948 |
| 649,254 | Great Britain | Jan. 24, 1951 |
| 786,624 | Great Britain | Nov. 20, 1957 |

OTHER REFERENCES

Printed Circuit Techniques, National Bureau of Standards Circular 468. Copy for sale by Superintendent of Documents, U.S. Government Printing Office, Washington, D.C.